(12) United States Patent
Hirabayashi

(10) Patent No.: US 8,181,142 B2
(45) Date of Patent: May 15, 2012

(54) METHOD OF PROCESSING DUMMY PATTERN BASED ON BOUNDARY LENGTH AND DENSITY OF WIRING PATTERN, SEMICONDUCTOR DESIGN APPARATUS AND SEMICONDUCTOR DEVICE

(75) Inventor: Keisuke Hirabayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/923,137

(22) Filed: Sep. 3, 2010

(65) Prior Publication Data

US 2010/0327467 A1 Dec. 30, 2010

Related U.S. Application Data

(63) Continuation of application No. 12/007,439, filed on Jan. 10, 2008, now Pat. No. 7,900,177.

(30) Foreign Application Priority Data

Jan. 11, 2007 (JP) ................................. 2007-003173

(51) Int. Cl.
G06F 17/50 (2006.01)
(52) U.S. Cl. ........ 716/122; 716/106; 716/118; 716/119; 716/125; 716/132
(58) Field of Classification Search .................. 716/106, 716/118, 119, 122, 125, 132
See application file for complete search history.

(56) References Cited

U.S. PATENT DOCUMENTS

| | | | |
|---|---|---|---|
| 7,013,446 B2 | 3/2006 | Ohba et al. | |
| 7,062,732 B2 | 6/2006 | Ito et al. | |
| 7,171,645 B2 | 1/2007 | Ito et al. | |
| 2004/0102034 A1 | 5/2004 | Ito et al. | |
| 2004/0139412 A1 | 7/2004 | Ito et al. | |

FOREIGN PATENT DOCUMENTS

| | | |
|---|---|---|
| JP | 2000-277615 | 10/2000 |
| JP | 2002-198435 | 7/2002 |
| JP | 2004-39951 A | 2/2004 |
| JP | 2004-88102 A | 3/2004 |
| JP | 2005-39072 A | 2/2005 |

OTHER PUBLICATIONS

Kurokawa et al.,"Dummy Filling Methods for Reducing Interconnect Capacitance and Number of Fills", Mar. 2005, Sixth International Symposium on Quality of Electronic Design, Technical Report pp. 586-591.*
Scagnelli et al., "Pattern Density Methodology Using IBM Foundry Technologies", May 2007, 57th Electronic Component and Technology Conference, Proceedings, pp. 1300-1307.*
Notification of Reason(s) for Refusal dated Jun. 28, 2011, with English translation.

* cited by examiner

*Primary Examiner* — Sun Lin
(74) *Attorney, Agent, or Firm* — McGinn IP Law Group, PLLC

(57) ABSTRACT

A semiconductor device, includes a first wiring pattern in a first region, a second wiring pattern in a second region, and at least one first dummy pattern formed in the first region and at least one second dummy pattern formed in the second region. A total area of the at least one first dummy pattern is the same as a total area of the at least one second dummy pattern and a total length of pattern periphery of the at least one second dummy pattern is longer than a total length of pattern periphery of the at least one first dummy pattern.

5 Claims, 15 Drawing Sheets

METHOD OF PROCESSING DUMMY PATTERN BASED ON BOUNDARY LENGTH AND DENSITY OF WIRING PATTERN, SEMICONDUCTOR DESIGN APPARATUS AND SEMICONDUCTOR DEVICE

The present application is a Continuation Application of U.S. patent application Ser. No. 12/007,439, filed on Jan. 10, 2008, now U.S. Pat. No. 7,900,177, which is based on Japanese patent application No. 2007-003173, filed on Jan. 11, 2007, the entire contents of which is incorporated herein by reference.

BACKGROUND OF THE INVENTION

1. Field of the Invention

The present invention relates to a method of placing dummy patterns, a semiconductor design apparatus and a semiconductor device, and particularly relates to a method of placing dummy patterns, a semiconductor design apparatus and a semiconductor device, which curb variations in the total length of the peripheries of wiring patterns and dummy patterns in a chip.

2. Description of Related Art

In recent years, semiconductor devices have been advancing toward multilayer wiring. With multilayer wiring, the high level the wiring layer is, the larger the unevenness of a plane where the wiring is formed becomes. Thus, there may occur a problem of breaking of wire and the like in a wiring layer which is formed in an upper layer. Accordingly, a technology is known of placing dummy patterns in a region where a wiring pattern is not formed and reducing the unevenness of the wiring layer in order to increase reliability in the wiring formation. This technology of placing dummy patterns is disclosed in Japanese Patent Application Laid-open No. 2000-277615.

A schematic view of a wiring region in the application is shown in FIG. 16. As shown in FIG. 16, dummy patterns 110 with low metal density are placed in blocks close to wiring patterns 100 placed in specified regions, and dummy patterns 120 with high metal density are placed away from the metal wiring. The dummy patterns uniform the density of the wiring patterns in a chip. In addition, dummy patterns with low metal density are placed in the vicinity of the wiring patterns 100. This makes it possible to reduce influence of parasitic capacity formed between the wiring patterns and the dummy patterns.

Moreover, in Japanese Patent Application Laid-open No. 2002-198435, described is a phenomenon in which the effects of a sidewall protective film for avoiding side-etching in a dry etching process decrease as the area of the sidewall of an etched film increases, and in which accordingly a CD (Critical Dimension) loss is caused. In this application, this problem is solved by adjusting the length of the peripheries of line-shaped patterns per unit area within a specified range. More specifically, described is a technology of adding rectangle- or line-shaped dummy patterns in order to adjust the length of the peripheries per unit area to within a specified range.

In semiconductor devices, making uniform a pattern density as disclosed in the first application and adjusting the length of the peripheries per unit area to within a specified range as disclosed in the second application are both matters related to etching. However, the former is caused by changes in etching rate and the latter is caused by decrease in the effects of a sidewall protective film. Their causes are different from each other, so that both of them have to be considered at the same time. However, both applications, discloses no technology taking into account these causes at the same time. Additionally, even if the method of adding dummy patterns disclosed in the first application is simply combined with the method of adding dummy patterns disclosed in the second application, the combination of the methods is not an appropriate method of adding dummy patterns. In other words, when the length of the peripheries of the dummy patterns is considered after the dummy patterns are added to uniform the pattern density, there is a possibility that the periphery length can meet the requirement but the pattern density fails. In this case, adjustments for uniforming the pattern density must further be made. Moreover, since dummy patterns are further added to the already-added dummy patterns, the dummy patterns may occupy the wiring region redundantly. In this case, for example, an attempt to make adjustments to the wiring patterns after completing the layout may result in an insufficiency in the wiring region, and this may require the whole layout to be designed again.

SUMMARY

A method of placing a dummy pattern in a wiring region includes calculating a density of a wiring pattern in the wiring region and calculating a value of a length of a periphery of the wiring pattern. The dummy pattern is then set such that a total of the pattern density and the value of the length of the periphery of the wiring pattern and the dummy pattern in the wiring region falls within specified ranges in the wiring region.

In the method of placing dummy patterns according to the present invention, the dummy patterns are placed such that the pattern density of the wiring patterns and the total value of the length of the peripheries in each divided region fall within the specified ranges. Accordingly, the pattern density of the wiring patterns and the total value of the length of the peripheries fall within the specified ranges all over the wiring region. Accordingly, it is possible to curb variations in the wiring patterns formed in the etching process.

According to a method of placing dummy patterns, a semiconductor design apparatus and a semiconductor manufacturing apparatus of the present invention, it is possible to curb variations in wiring patterns caused in the etching process.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE
EXEMPLARY EMBODIMENT

First Embodiment

Figure 1:
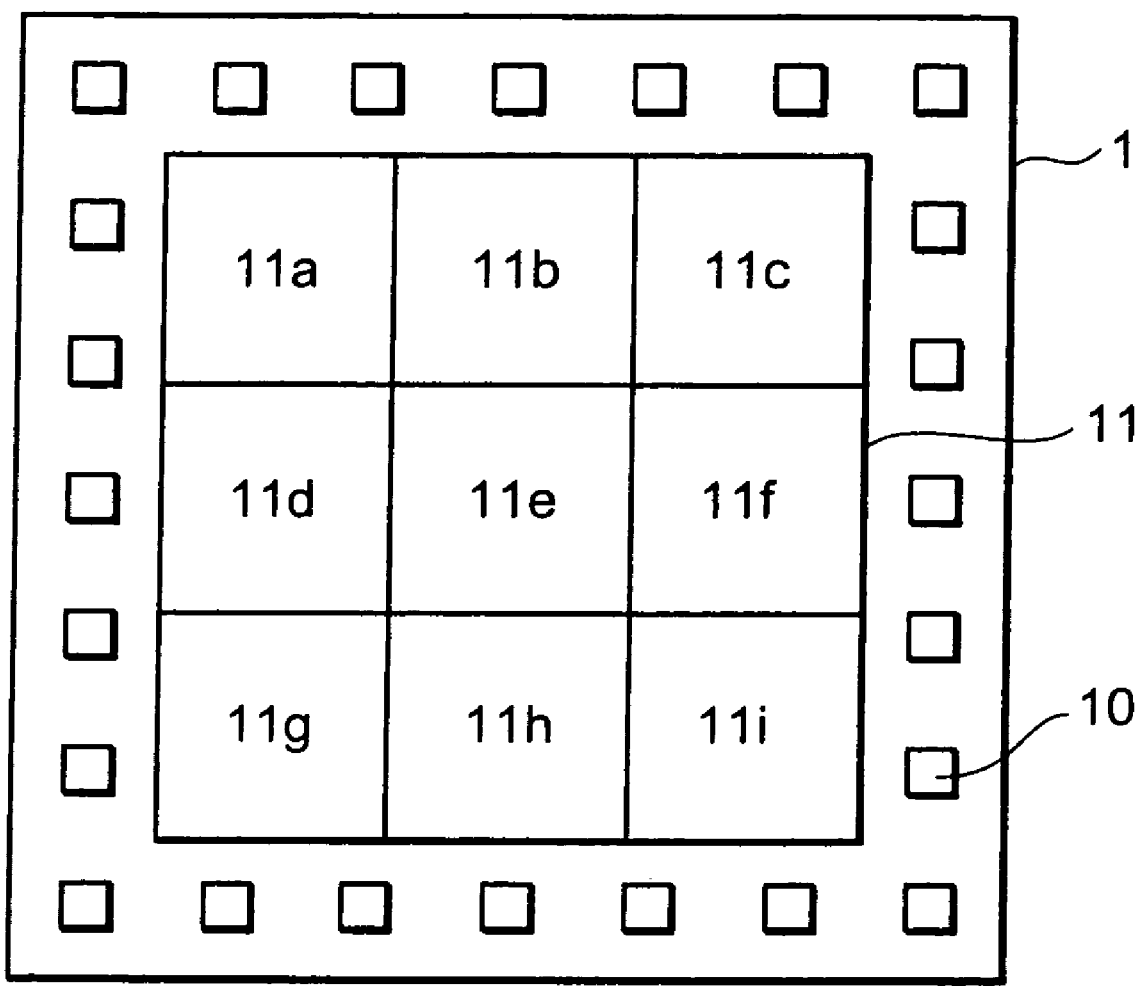
FIG. 1 is a diagrammatic view of a semiconductor device according to a first embodiment.

FIG. 1 shows a diagrammatic view of a semiconductor device 1 according to a first embodiment. As shown in FIG. 1, the semiconductor device 1 includes pads 10 being input/output terminals of the semiconductor device 1 and a wiring region 11 where wiring patterns of the semiconductor device 1 are formed. The wiring region 11 is divided into a plurality of divided regions 11a to 11i. The divided regions 11a to 11i are set such that each region has the same area, for example. Taking the divided regions 11a to 11d as examples out of the divided regions 11a to 11i, detailed descriptions will be given of the relation between wiring patterns and dummy patterns in a divided region. Please note that wiring patterns and dummy patterns are patterns which are formed of the same material on a semiconductor device, and are made of a metal material such as aluminum or copper.

Figure 2:
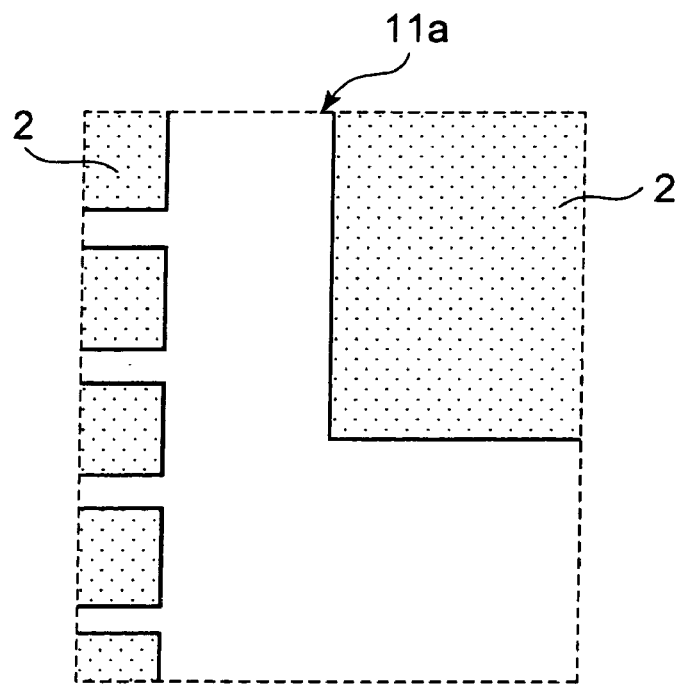
FIG. 2 is a diagrammatic view of the layout of a divided region 11a according to the first embodiment.
Figure 2:
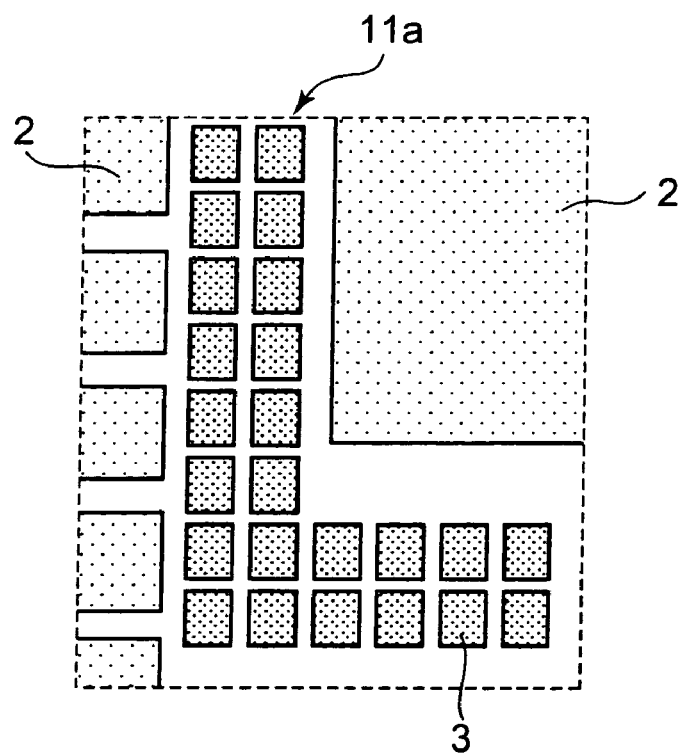

Descriptions will be given of the divided region 11a. FIG. 2 (a) shows a diagrammatic view of layout before placing dummy patterns in the divided region 11a. Furthermore, FIG. 2 (b) shows a diagrammatic view of layout where dummy patterns are placed in addition to wiring patterns in the divided region 11a. As shown in FIG. 2 (a), divided wiring patterns 2 are placed in the left of the drawing in the divided region 11a, and a wiring pattern 2 larger than the wiring patterns 2 placed in the left is placed in the right of the drawing. In the layout shown in FIG. 2 (b), dummy patterns 3 are placed in a region where the wiring patterns 2 are not placed.

Figure 3:
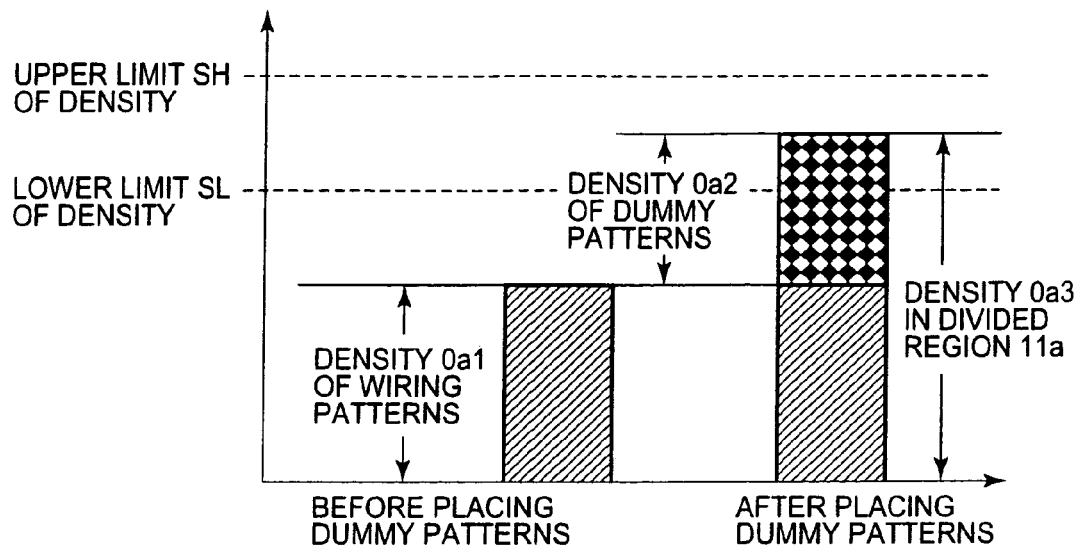
FIG. 3 is a view showing the relation of values related to a density and a periphery length in the divided region 11a according to the first embodiment.
Figure 3:
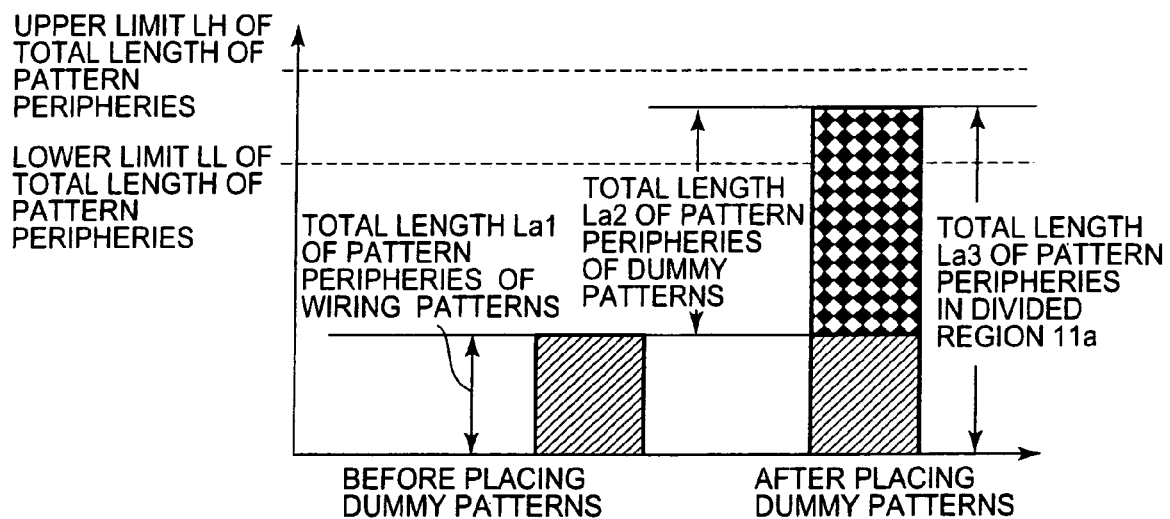

Here, FIG. 3 (a) shows the relation between the pattern density of the divided region 11a before placing the dummy patterns and the pattern density of the divided region 11a after placing the dummy patterns. In addition, FIG. 3 (b) shows the relation between the total length of the pattern peripheries in the divided region 11a before placing the dummy patterns and the total length of the pattern peripheries in the divided region 11a after placing the dummy patterns. Here, the density in the embodiment means the density of the wiring patterns including the wiring patterns 2 and the dummy patterns 3 in the area of the divided region. Furthermore, the total length of the pattern peripheries means the total value of sides included in a divided region out of the sides of patterns laid out. A wiring boundary length may be used as the (total) length of the pattern peripheries (periphery).

The semiconductor device 1 of the embodiment is designed to confine both of the pattern density and the total length of the pattern peripheries in each divided region within specified ranges. For example, with regard to the pattern density, an upper limit value SH and a lower limit value SL of the density are preset, and the semiconductor device 1 is designed to have a pattern density in a divided region within a range of the lower limit value SL to the upper limit value SH, inclusive. Additionally, with regard to the total length of the pattern peripheries, an upper limit value LH and a lower limit value LL of the total length of the pattern peripheries are preset, and the semiconductor device 1 is designed to have the total length of the pattern peripheries in a divided region within a range of the lower limit value LL to the upper limit value LH, inclusive. Please note that with regard to the length of pattern peripheries, it is simply referred to as the length of pattern peripheries, but it can be the total of the sides of the patterns, or can be one which approximates to the length of the sides of the patterns. The upper and lower limit values of the density and the upper and lower limit values of the total length of the pattern peripheries are values which are set in accordance with the manufacturing process. For example, these values are set to satisfy a condition that is possible to confine variations in patterns to be produced within specified ranges, without changing the manufacturing conditions in the manufacturing process.

As shown in FIG. 3 (a), a pattern density Oa1 before placing the dummy patterns in the divided region 11a is lower than the lower limit value SL of the pattern density. In contrast, a pattern density Oa3 after placing the dummy patterns has a value between the upper limit value SH of the density and the lower limit value SL of the density by placing the dummy patterns having a pattern density Oa2. Here, the pattern density Oa3 is a value which is found by adding the pattern density Oa1 and the pattern density Oa2.

As shown in FIG. 3 (b), a total length La1 of the pattern peripheries before placing the dummy patterns is smaller than the lower limit value LL of the total length of the pattern peripheries. In contrast, a total length La3 of the pattern peripheries after placing the dummy patterns has a value between the upper limit value LH of the total length of the pattern peripheries and the lower limit value LL of the total length of the pattern peripheries, by placing the dummy patterns having a total length La2 of the pattern peripheries. Here, the total length La3 of the pattern peripheries is a value which is found by adding the total length La1 of the pattern peripheries and the total length La2 of the pattern peripheries.

Figure 4:
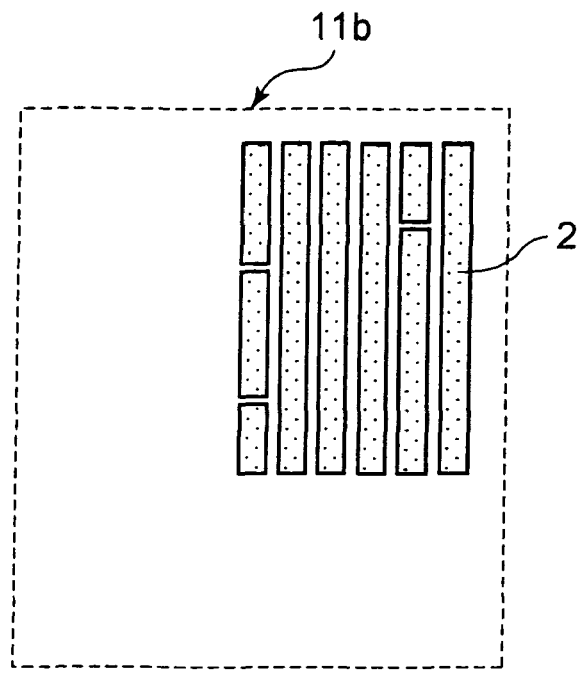
FIG. 4 is a diagrammatic view of the layout of a divided region 11b according to the first embodiment.
Figure 4:
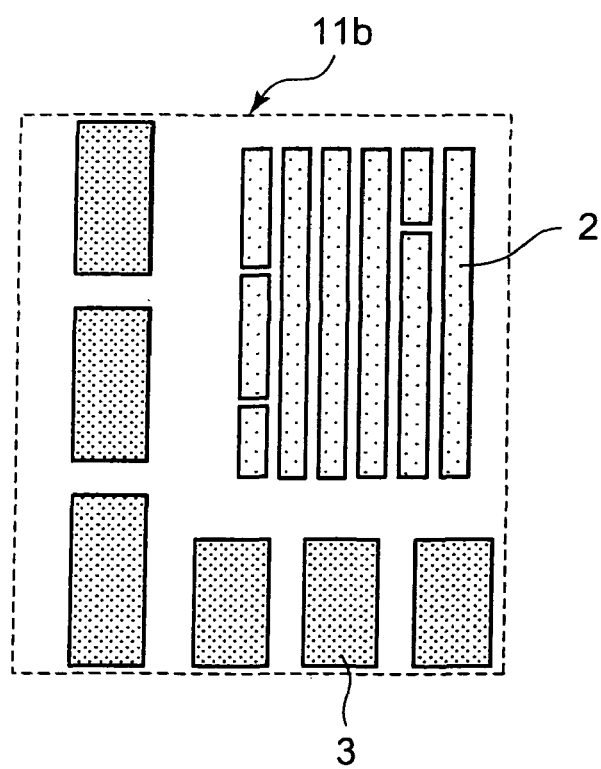

Descriptions will be given of the divided region 11b. FIG. 4 (a) shows a diagrammatic view of the layout before placing dummy patterns in the divided region 11b. FIG. 4 (b) shows a diagrammatic view of the layout where the dummy patterns are placed in addition to wiring patterns in the divided region 11b. As shown in FIG. 4 (a), the divided wiring patterns 2 are placed in the top right of the drawing in the divided region 11b. Each area of the wiring patterns 2 placed in the divided region 11b is smaller than each area of the wiring patterns placed in the divided region 11a. In the layout shown in FIG. 4 (b), dummy patterns 3 are placed in a region where the wiring patterns 2 are not placed.

Figure 5:
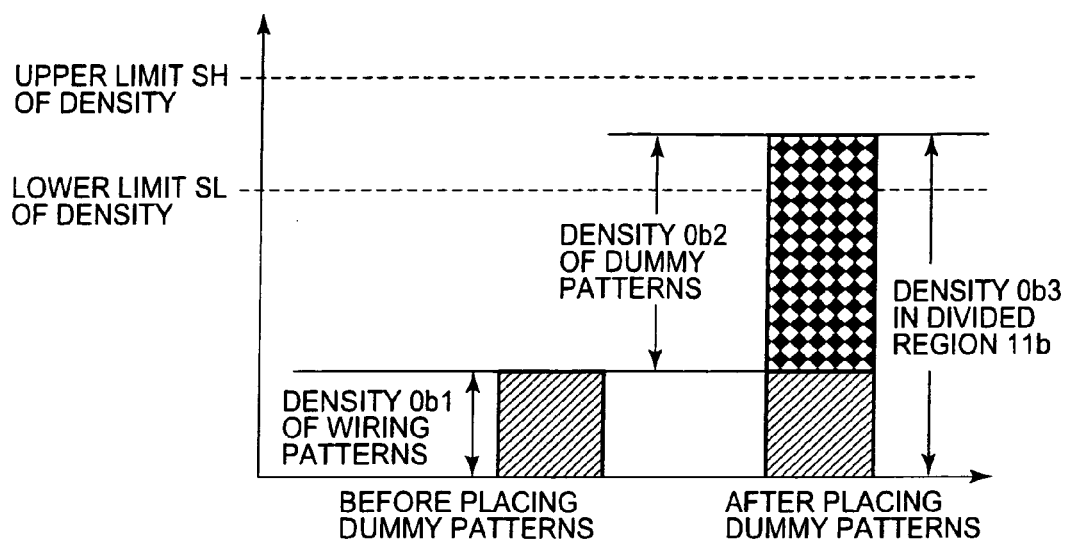
FIG. 5 is a view showing the relation of values related to a density and a periphery length in the divided region 11b according to the first embodiment.
Figure 5:
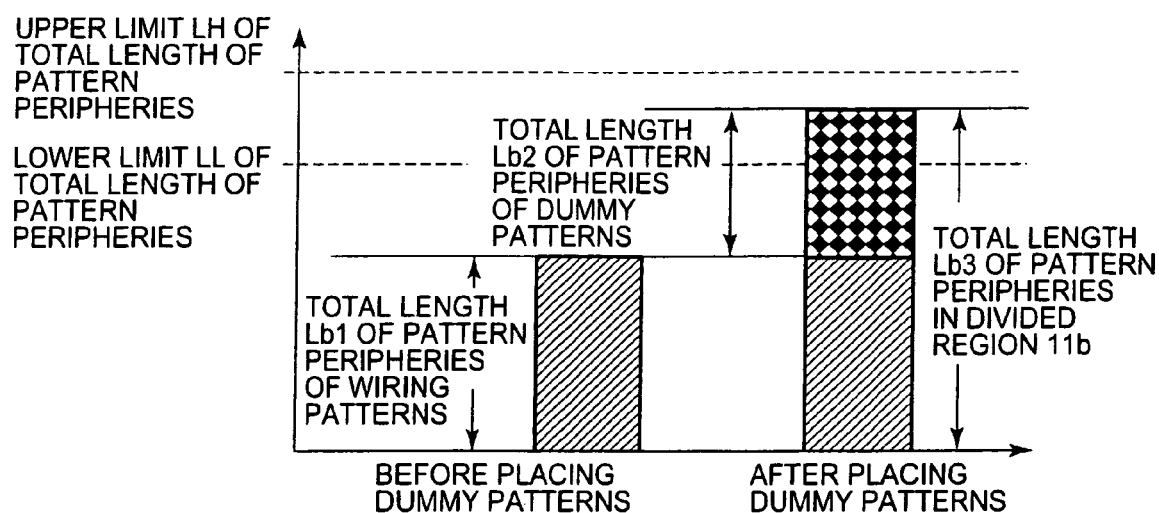

Here, FIG. 5 (a) shows the relation between the pattern density of the divided region 11b before placing the dummy patterns and the pattern density of the divided region 11b after placing the dummy patterns. In addition, FIG. 5 (b) shows the relation between the total length of the pattern peripheries in the divided region 11b before placing the dummy patterns and the total length of the pattern peripheries in the divided region 11b after placing the dummy patterns.

As shown in FIG. 5 (a), a pattern density Ob1 before placing the dummy patterns in the divided region 11b is lower than the lower limit value SL of the pattern density. In contrast, a pattern density Ob3 after placing the dummy patterns has a value between the upper limit value SH of the density and the lower limit value SL of the density, by placing the dummy patterns having a pattern density Ob2. Here, the pattern density Ob3 is a value which is found by adding the pattern density Ob1 and the pattern density Ob2.

As shown in FIG. 5 (b), a total length Lb1 of the pattern peripheries before placing the dummy patterns is smaller than the lower limit value LL of the total length of the pattern peripheries. In contrast, a total length Lb3 of the pattern peripheries after placing the dummy patterns has a value between the upper limit value LH of the total length of the pattern peripheries and the lower limit value LL of the total length of the pattern peripheries, by placing the dummy patterns having a total length Lb2 of the pattern peripheries. Here, the total length Lb3 is a value which is found by adding the total length Lb1 of the pattern peripheries and the total length Lb2 of the pattern peripheries.

Figure 6:
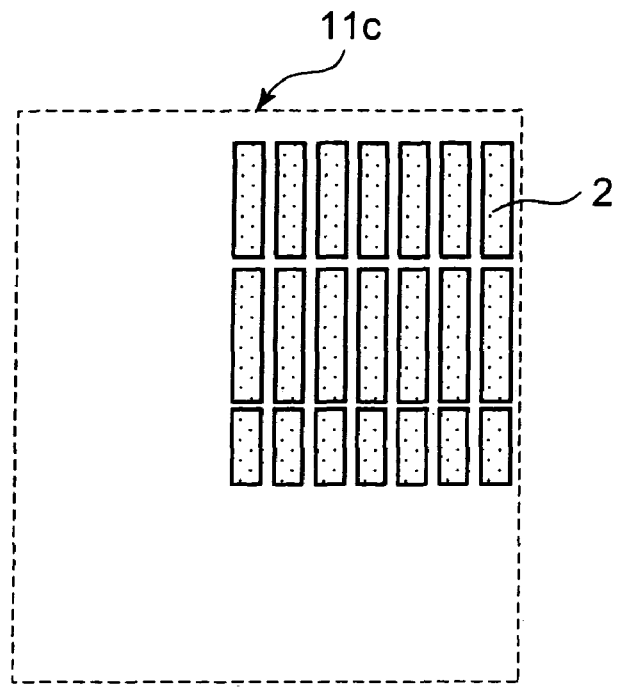
FIG. 6 is a diagrammatic view of the layout of a divided region 11c according to the first embodiment.
Figure 6:
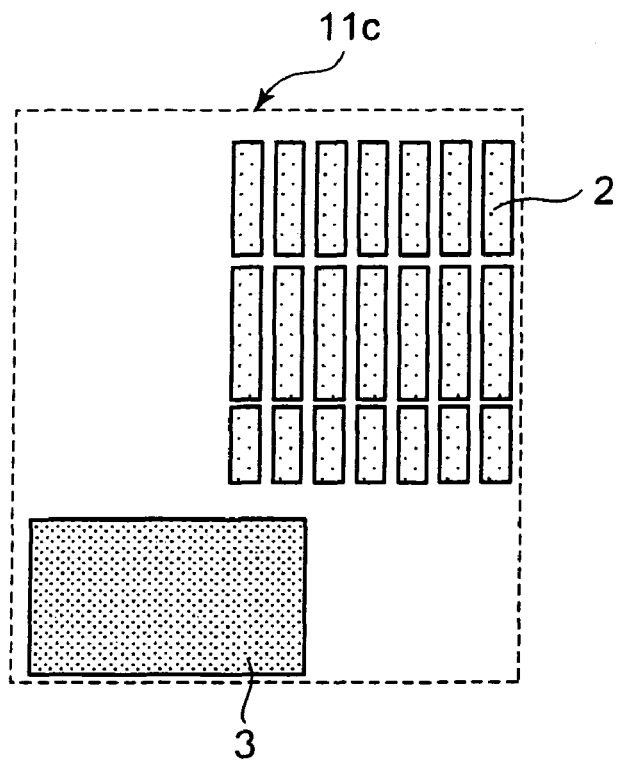

Descriptions will be given of the divided region 11c. FIG. 6 (a) shows a diagrammatic view of the layout before placing a dummy pattern in the divided region 11c. FIG. 6 (b) shows a diagrammatic view of the layout where the dummy pattern, as well as wiring patterns, is placed in the divided region 11c. As shown in FIG. 6 (a), the divided wiring patterns 2 are placed in the top right of the drawing in the divided region 11c. Each area of the wiring patterns 2 placed in the divided region 11c is smaller than the areas of the wiring patterns 2 placed in the divided region 11a. Furthermore, the wiring patterns 2 placed in the divided region 11c have the total length of the pattern peripheries which is longer than that of the wiring patterns placed in the divided region 11b. In the layout shown in FIG. 6 (b), the dummy pattern 3 is placed in a region where the wiring patterns 2 are not placed.

Figure 7:
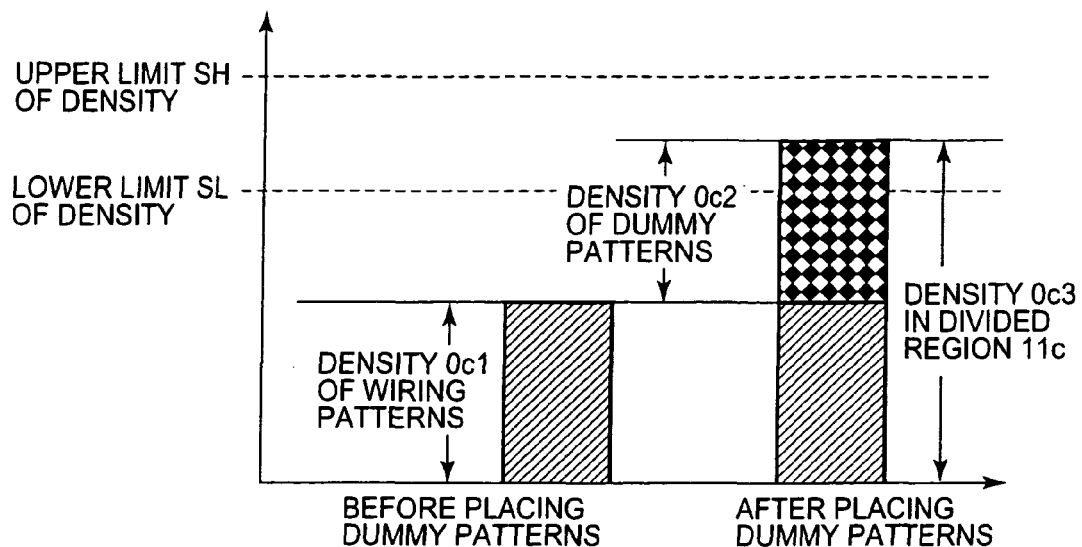
FIG. 7 is a view showing the relation of values related to a density and a periphery length in the divided region 11c according to the first embodiment.
Figure 7:
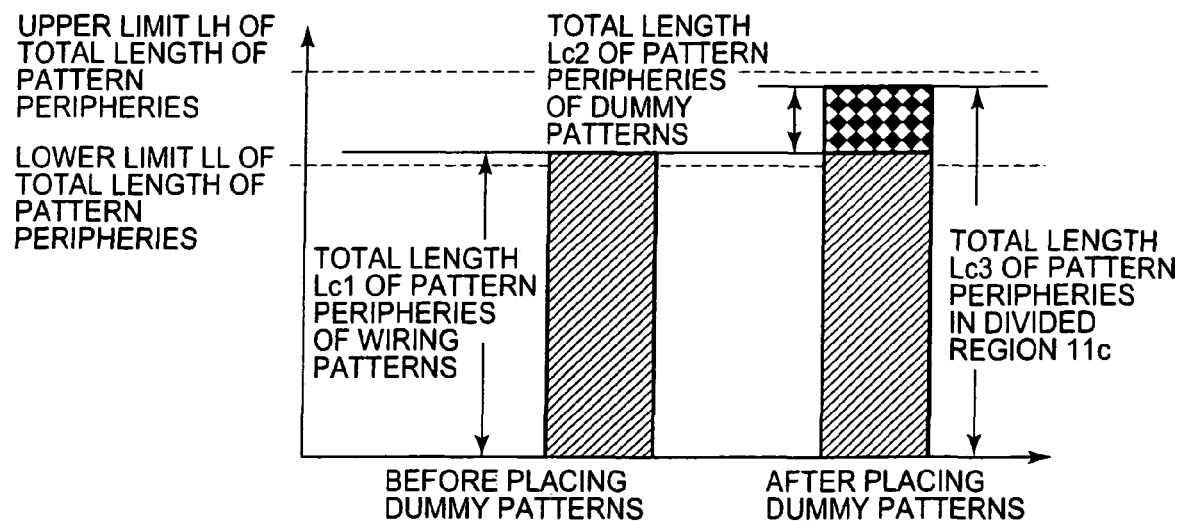

Here, FIG. 7 (a) shows the relation between the pattern density of the divided region 1 is before placing the dummy pattern and the pattern density of the divided region 11c after placing the dummy pattern. In addition, FIG. 7 (b) shows the relation between the total length of the pattern peripheries in the divided region 11c before placing the dummy pattern and the total length of the pattern peripheries in the divided region 11c after placing the dummy pattern.

As shown in FIG. 7 (a), a pattern density Oc1 before placing the dummy pattern in the divided region 11c is lower than the lower limit value SL of the pattern density. In contrast, a pattern density Oc3 after placing the dummy pattern has a value between the upper limit value SH of the density and the lower limit value SL of the density, by placing the dummy pattern having a pattern density Oc2. Here, the pattern density Oc3 is a value which is found by adding the pattern density Oc1 and the pattern density Oc2.

As shown in FIG. 7 (b), a total length Lc1 of the pattern peripheries before placing the dummy patterns is longer than the lower limit value LL of the total length of the pattern peripheries, and is shorter than the upper limit value LL of the total length of the pattern peripheries. Hence, the total length Lc2 of the pattern periphery of the dummy pattern to be placed is set to be within a range where the sum of the total length Lc2 and the total length Lc1 of the pattern peripheries of the wiring patterns does not exceed the upper limit value LH of the total length of the pattern peripheries. Consequently, the total length Lc3 of the pattern peripheries after placing the dummy patterns has a value between the upper limit value LH of the total length of the pattern peripheries and the lower limit value LL of the total length of the pattern peripheries. Here, the total length Lb3 is a value which is found by adding the total length Lb1 of the pattern peripheries and the total length Lb2 of the pattern periphery.

Figure 8:
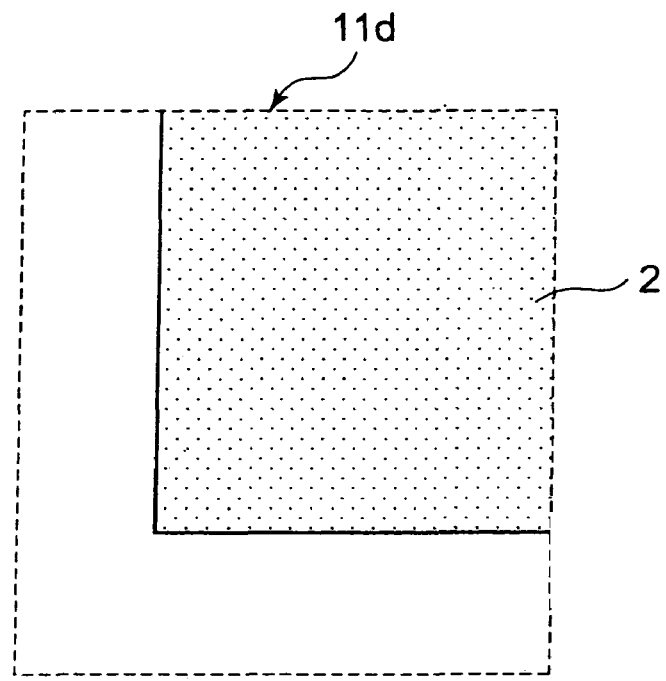
FIG. 8 is a diagrammatic view of the layout of a divided region 11d according to the first embodiment.
Figure 8:
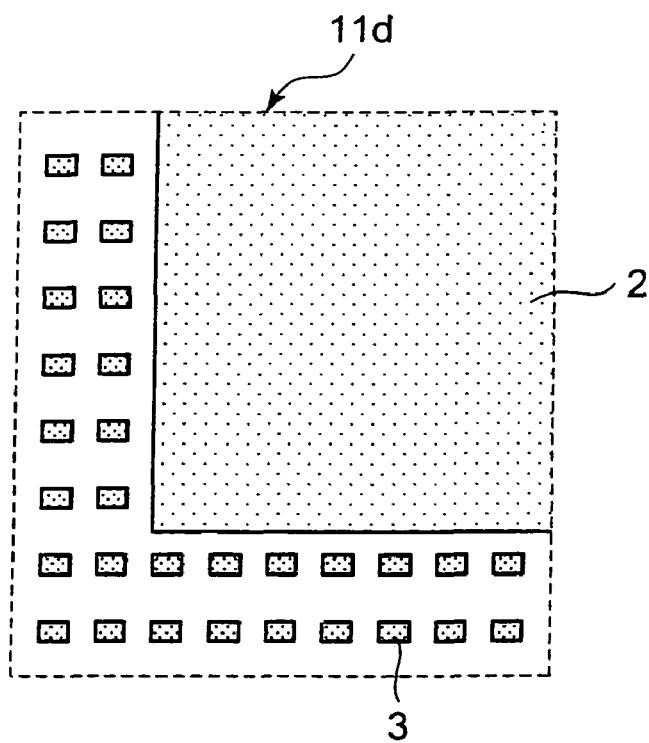

Descriptions will be given of the divided region 11d. FIG. 8 (a) shows a diagrammatic view of the layout before placing the dummy patterns in the divided region 11d. In addition, FIG. 8 (b) shows a diagrammatic view of the layout where the dummy patterns are placed in addition to a wiring pattern in the divided region 11d. As shown in FIG. 8 (a), the wiring pattern 2 which is a single pattern occupying a large area is placed in the top right of the drawing in the divided region 11d. The wiring pattern 2 placed in the divided region 11d has an area larger than the area of the wiring patterns placed in the divided region 11a. Furthermore, the wiring pattern 2 placed in the divided region 11d has the total length of the pattern peripheries which is shorter than that of the wiring patterns placed in the divided region 11a. In the layout shown in FIG. 8 (b), the dummy patterns 3 are placed in a region where the wiring pattern 2 is not placed.

Figure 9:
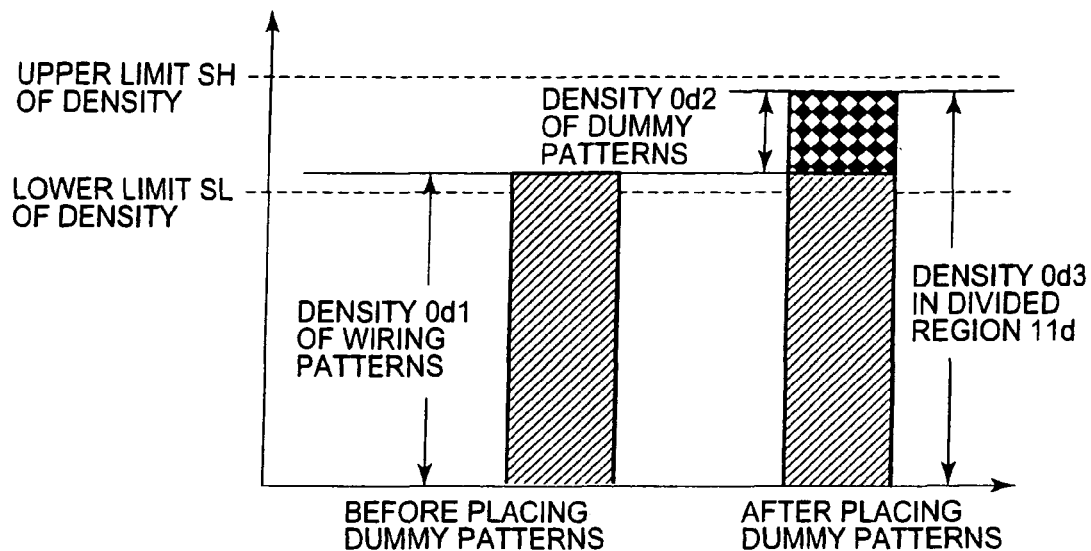
FIG. 9 is a view showing the relation of values related to a density and a periphery length in the divided region 11d according to the first embodiment.
Figure 9:
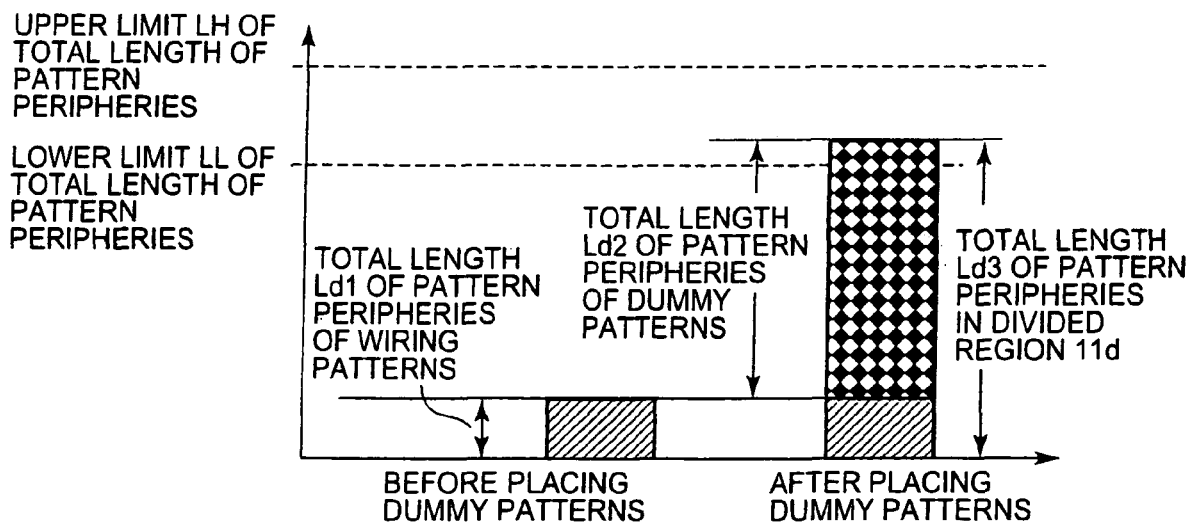

Here, FIG. 9 (a) shows the relation between the pattern density of the divided region 11d before placing the dummy patterns and the pattern density of the divided region 11d after placing the dummy patterns. Moreover, FIG. 9 (b) shows the relation between the total length of the pattern peripheries in the divided region 11d before placing the dummy patterns and the total length of the pattern peripheries in the divided region 11d after placing the dummy patterns.

As shown in FIG. 9 (a), a pattern density Od1 before placing the dummy patterns in the divided region 11d is higher than the lower limit value SL of the pattern density and is lower than the upper limit value SH of the pattern density. Hence, a pattern density Od2 of the dummy pattern to be placed is set to be within a range where the sum of the pattern density Od2 and the pattern density Od1 of the wiring patterns does not exceed the upper limit value SH of the total length of the pattern peripheries. Consequently, a pattern density Od3 after placing the dummy patterns has a value between the upper limit value SH of the density and the lower limit value SL of the density. Here, the pattern density Od3 is a value which is found by adding the pattern density Od1 and the pattern density Od2.

As shown in FIG. 9 (b), a total length Ld1 of the pattern periphery before placing the dummy patterns is smaller than the lower limit value LL of the total length of the pattern peripheries. Accordingly, a total length Ld3 of the pattern peripheries after placing the dummy patterns has a value between the upper limit value LH of the total length of the pattern peripheries and the lower limit value LL of the total length of the pattern peripheries, by placing the dummy patterns having a total length Ld2 of the pattern peripheries. Here, the total length Ld3 is a value which is found by adding the total length Ld1 of the pattern periphery and the total length Ld2 of the pattern peripheries.

According to the above descriptions, the dummy patterns are placed in the semiconductor device 1 of the embodiment such that the pattern density and the total length of the pattern peripheries in a divided region fall within specified ranges all over the wiring region. In other words, in the layout after placing the dummy patterns, variations in the pattern density and those in the total length of the pattern peripheries fall within the specified ranges all over the wiring region. Hence, it is possible to curb variations in etching rate in the etching process all over the wiring region. Accordingly, variations in the formed patterns within the wiring region become smaller. Consequently, the semiconductor device 1 of the embodiment makes it possible to curb variations in the formed patterns and to improve the reliability.

Moreover, variations in the pattern density among divided regions too are curbed in the semiconductor device 1 of the embodiment. Since the surface of a wiring layer becomes flat accordingly, it is possible to reduce unevenness caused in the wiring layer which is formed in an upper layer in multilayer wiring. Consequently, it is also possible to improve the reliability in the semiconductor device 1 of the embodiment.

Figure 10:
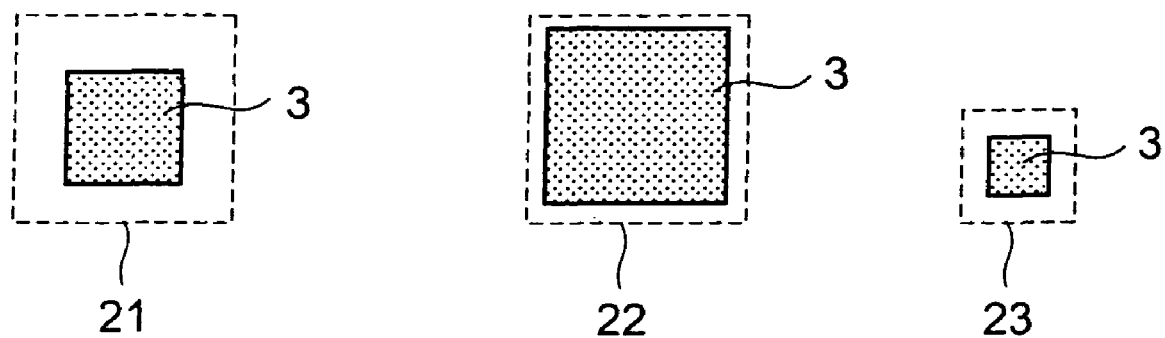
FIG. 10 is a diagrammatic view of dummy cells placed in the first embodiment.

On the other hand, further detailed descriptions will be given of the placed dummy patterns in the above descriptions. The area of the patterns to be placed is set based on a difference between the pattern density of wiring patterns and the upper or lower limit value of the pattern density. Furthermore, the total length of the pattern peripheries of the patterns to be placed is set based on a difference between the total length of the pattern peripheries of the wiring patterns and the upper or lower limit value of the total length of the pattern peripheries. However, if the shape of a dummy pattern is decided based on the calculated differences whenever placing a dummy pattern, it takes more time to complete the layout. Thus, the embodiment uses dummy patterns which are previously registered as layout cells in a database such as a layout library. In the embodiment, a plurality of dummy cells having different areas of the dummy patterns and different total values of the length of the peripheries of the dummy patterns are different respectively are registered as the layout cells. FIG. 10 shows examples of the dummy cells. FIG. 10 shows three types of dummy patterns of dummy cells 21 to 23.

As shown in FIG. 10, the dummy cell 21 has the same cell area as the dummy cell 22. Additionally, the dummy pattern of the dummy cell 21 occupies an area of approximately 25% out of the cell area. On the other hand, the dummy pattern of the dummy cell 22 occupies an area of approximately 80% of the cell area. Moreover, the dummy cell 23 has the cell area which is approximately 25% as large as the cell areas of the dummy cells 22 and 23. The dummy pattern of the dummy cell 23 occupies an area of approximately 25% of the cell area. Please note that the shapes of the dummy cells and the dummy patterns are not limited to those shown in FIG. 10, but it is possible to appropriately change them.

The dummy cells 21 to 23 are placed in a region where wiring patterns are not placed, in accordance with the pattern density and total length of the pattern peripheries of the wiring patterns. For example, when the pattern density is high and the total length of the pattern peripheries is short, multiple dummy cells 23, which are the smallest in cell area and dummy pattern area, are placed. Consequently, while an increase in pattern density is curbed, the total length of the pattern peripheries is made longer. On the other hand, when the pattern density is low and the total length of the pattern peripheries is long, only a few dummy cells 22, which are the largest in cell area and dummy pattern area, are placed. Consequently, while the pattern density is made high, an increase in the total length of the pattern peripheries is curbed.

Figure 11:
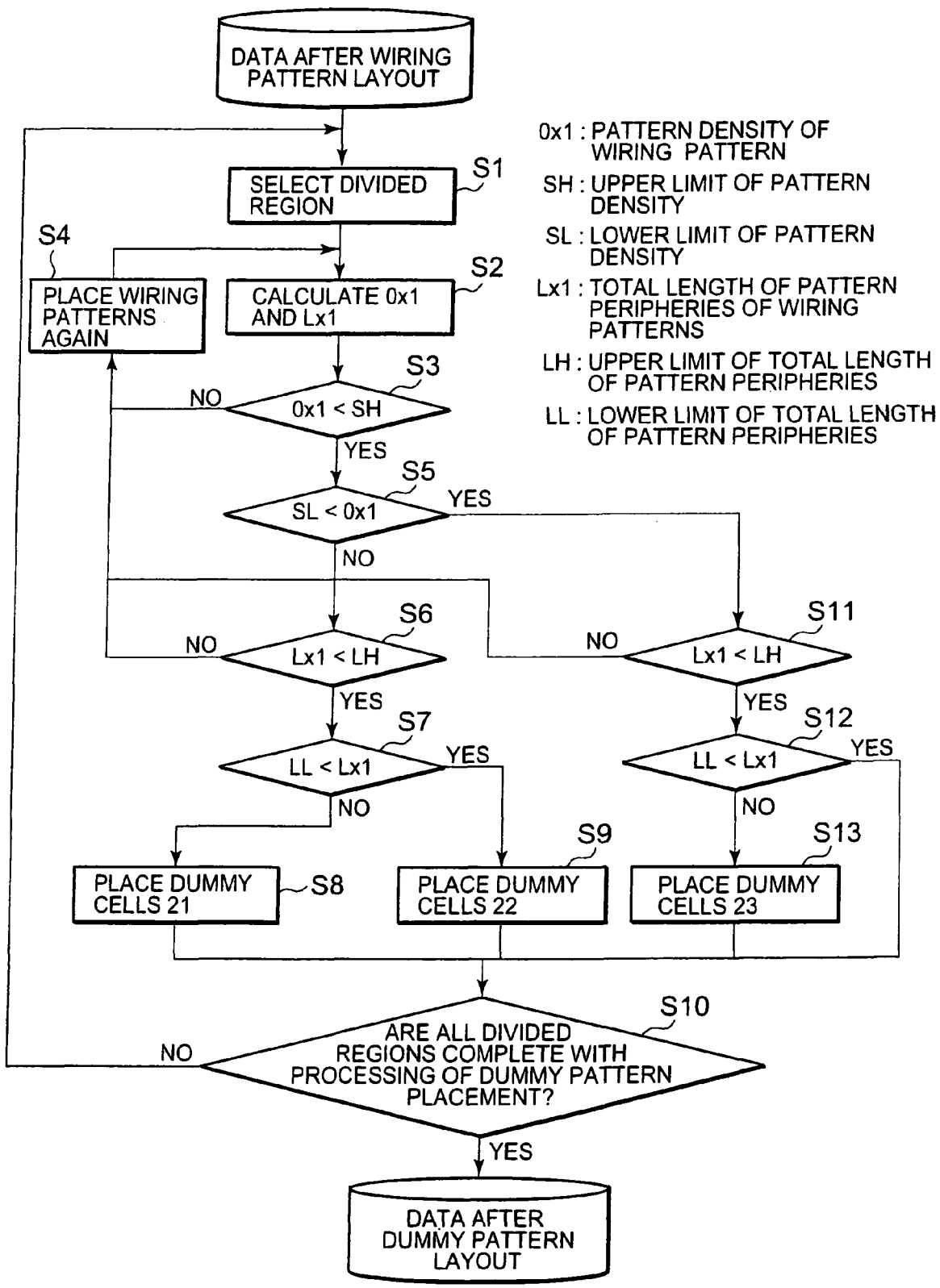
FIG. 11 is a flow chart of a method of placing dummy patterns according to the first embodiment.

Further detailed descriptions will be given of a method of placing dummy patterns. FIG. 11 shows a flow chart of the method of placing dummy patterns. In the flow of placing dummy patterns, data collected after laying wiring patterns out, when the placement of wiring patterns is completed is firstly read in. Next, divided regions are derived from the read data, and one of the derived divided regions is selected (Step S1). Then, a density Ox1 of the wiring patterns and a total length Lx1 of the pattern peripheries in the selected divided region is calculated (Step S2). Following this, the density Ox1 of the wiring patterns is compared with the preset upper limit value SH of the density (Step S3).

In Step S3, when the density Ox1 of the wiring patterns exceeds the upper limit value SH of the density (a branch of NO), the placement of the wiring patterns is performed again (Step S4). Subsequently, Step S2 is performed again. On the other hand, when the density Ox1 of the wiring patterns falls below the upper limit value SH of the density (a branch of YES), the density Ox1 of the wiring patterns is compared with the preset lower limit value SL of the density (Step S5).

Firstly, descriptions will be given of a case where the density Ox1 of the wiring patterns falls below the lower limit value SL of the density (a branch of NO) in Step S5. In this case, subsequently to Step S5, the total length Lx1 of the pattern peripheries is compared with the preset upper limit value LH of the total length of the pattern peripheries (Step S6). In Step S6, when the total length Lx1 of the pattern peripheries exceeds the upper limit value LH of the total length of the pattern peripheries (a branch of NO), the process goes back to Step S3, and the placement of the wiring patterns is performed again. On the other hand, when the total length Lx1 of the pattern peripheries falls below the upper limit value LH of the total length of the pattern peripheries (a branch of YES), the total length Lx1 of the pattern peripheries is compared with the lower limit value LL of the total length of the pattern peripheries (Step S7).

In Step S7, when the total length Lx1 of the pattern peripheries falls below the lower limit value LL of the total length of the pattern peripheries (a branch of NO), in terms of both the pattern density and the total length of the pattern peripheries, the wiring patterns do not fall within the specified ranges (for example, ranges between the upper and lower limit values of the respective values). Hence, the dummy cells 21 are placed in Step S8. The dummy cell 21 has the middle-sized area of the dummy pattern among the plurality of dummy cells, and can increase both of the pattern density and the total length of the pattern peripheries.

On the other hand, when the total length Lx1 of the pattern peripheries exceeds the upper limit value LL of the total length of the pattern peripheries (a branch of YES), the wiring patterns fall within the specified range in terms of the total length of the pattern peripheries, but do not fall within the specified range in terms of the pattern density. Accordingly, the dummy cells 22 are placed in Step S9. In the dummy cell 22, the dummy pattern having a larger area than that of the dummy cell 21 is placed, and it is possible to increase the pattern density while curbing an increase in the total length of the pattern peripheries. When finishing Step S8 or S9, it is judged that the process of placing dummy patterns has been performed on all the divided regions in a chip (Step S10). When there is any unprocessed divided region (a branch of NO), the process goes back to Step S1 again.

Next, descriptions will be given of a case where the density Ox1 of the wiring patterns exceeds the lower limit value SL of the density (a branch of YES) in Step S5. In this case, subsequently to Step S4, the total length Lx1 of the pattern peripheries is compared with the preset upper limit value LH of the total length of the pattern peripheries (Step S11). In Step S11, when the total length Lx1 of the pattern peripheries exceeds the upper limit value LH of the total length of the pattern peripheries (a branch of NO), the process goes back to Step S3, and the placement of the wiring patterns is performed again. On the other hand, when the total length Lx1 of the pattern peripheries falls below the upper limit value LH of the total length of the pattern peripheries (a branch of YES), the total length Lx1 of the pattern peripheries is compared with the lower limit value LL of the total length of the pattern peripheries (Step S12).

In Step S12, when the total length Lx1 of the pattern peripheries falls below the lower limit value LL of the total length of the pattern peripheries (a branch of NO), the wiring patterns fall within the specified range in terms of the pattern density, but do not fall within the specified range in terms of the total length of the pattern peripheries. Accordingly, the dummy cells 23 are placed in Step S13. The dummy cell 23 is small in cell area and dummy pattern area among the plurality of dummy cells, and can increase the total length of the pattern peripheries while curbing an increase in the pattern density. When Step S13 finishes, the process goes to Step S10. When there is any unprocessed divided region in Step S10 (the branch of NO), the process goes back to Step S1 again.

On the other hand, when the total length Lx1 of the pattern peripheries exceeds the lower limit LL of the total length of the pattern peripheries (a branch of YES), the wiring patterns fall within the specified ranges in terms of both of the pattern density and the total length of the pattern peripheries. Accordingly, the dummy patterns are not added, and the process goes to Step S10. When there is any unprocessed divided region (the branch of NO), the process goes back to Step S1 again.

Figure 12:
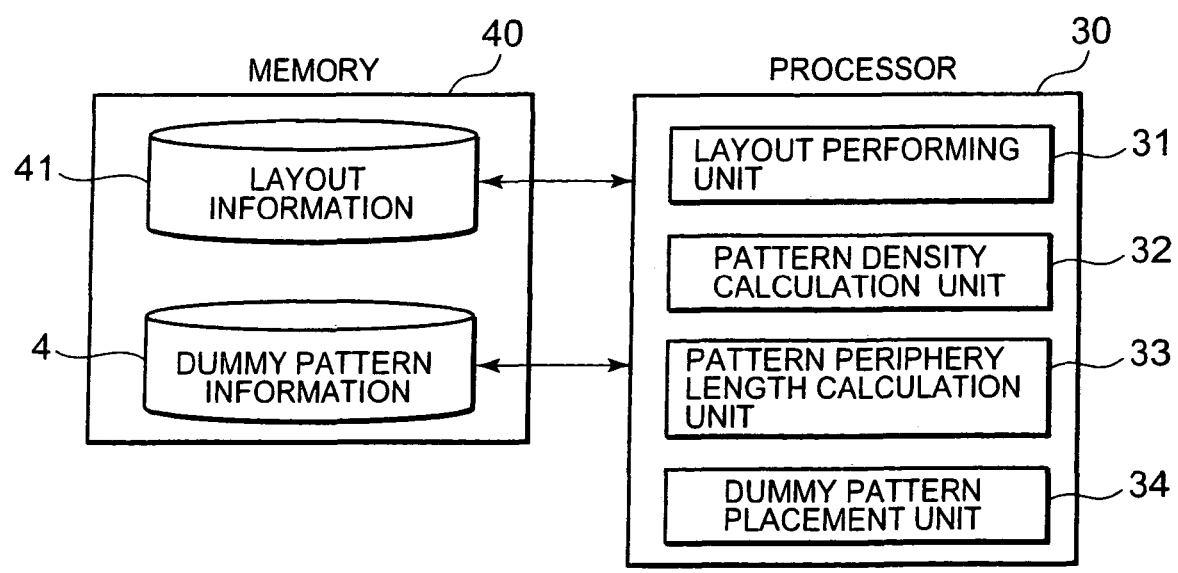
FIG. 12 is a block diagram of a semiconductor design apparatus according to the first embodiment.

The above flow of placing dummy patterns is performed by executing a program for a computer in a computer such as a semiconductor design apparatus shown in FIG. 12. The semiconductor design apparatus shown in FIG. 12 includes a processor 30 and a memory 40. The processor 30 has a layout performing unit 31, a pattern density calculation unit 32, a pattern periphery length calculation unit 33, and a dummy pattern placement unit 34. The layout performing unit 31 places wiring patterns, and sets and selects divided regions in a wiring region. These processes correspond to Steps S1 and S4 in the flow shown in FIG. 11. The pattern density calculation unit 32 executes a density calculation step and, for example, calculates the pattern density Ox1 and judges whether or not the pattern density Ox1 falls within the range of the upper and lower limit values. This density calculation step corresponds to Steps S2, S3, and S5 of the flow shown in FIG. 11. The pattern periphery length calculation unit 33 executes a periphery length calculation step and, for example, calculates the length Lx1 of the pattern peripheries and judges whether or not the length Lx1 of the pattern peripheries falls within the upper and lower limit values. The periphery length calculation step corresponds to Steps S6, S7, S11 and S12 of the flow shown in FIG. 11. The dummy pattern placement unit 34 executes a placement step and, for example, selects dummy cells to be placed and places the dummy patterns. This placement step corresponds to Steps S8, S9, and S13 of the flow shown in FIG. 11.

Moreover, the memory 40 has layout information 41 and dummy pattern information 42. The layout information 41 contains layout data before placing the dummy patterns and layout data after placing the dummy patterns. The dummy pattern information contains the pattern information of previously created dummy patterns.

According to the above descriptions, the method of placing dummy patterns of the embodiment makes it possible to compare wiring patterns and preset values and to place dummy patterns based on the comparison result so as to compensate for parameters which cannot meet desired values only with the placed wiring patterns. In other words, the method of placing dummy patterns of the embodiment makes it possible to realize the semiconductor device 1. Here, the desired value means one which falls within a range between the upper and lower limit values of the pattern density or one which falls within a range between the upper and lower limit values of the total length of the pattern peripheries. Moreover, the parameter means the total length of the pattern peripheries or the pattern density.

Furthermore, in the method of placing dummy patterns of the embodiment, a dummy pattern to be placed is selected from among the previously registered dummy cells. In addition, in the method of placing dummy patterns of the embodiment, the pattern density of the wiring patterns is compared with its upper and lower limit values and the total length of the pattern peripheries of the wiring patterns is compared with its upper and lower limit values. Then, taking the comparison result as difference values from the desired values of the respective parameters, the dummy cell is selected in accordance with the comparison result. Consequently, there is no need of creating a dummy pattern to be placed whenever placing a dummy pattern and it is possible to simplify the calculation of the difference values of the parameters. In other words, according to the method of placing dummy patterns of the embodiment, it is possible to simplify the creation of a dummy pattern at the design stage.

Second Embodiment

In the first embodiment, the shape of a dummy cell to be added is changed based on the density of the wiring patterns and the total value of the length of the peripheries of the wiring patterns. In contrast, a method of placing dummy patterns according to a second embodiment is to place a dummy cell in accordance with the density of the wiring patterns, and subsequently divide the placed dummy cell in accordance with the total value of the length of the peripheries of the wiring patterns in order to confine the total value of the length of the peripheries within a specified range.

Figure 13:
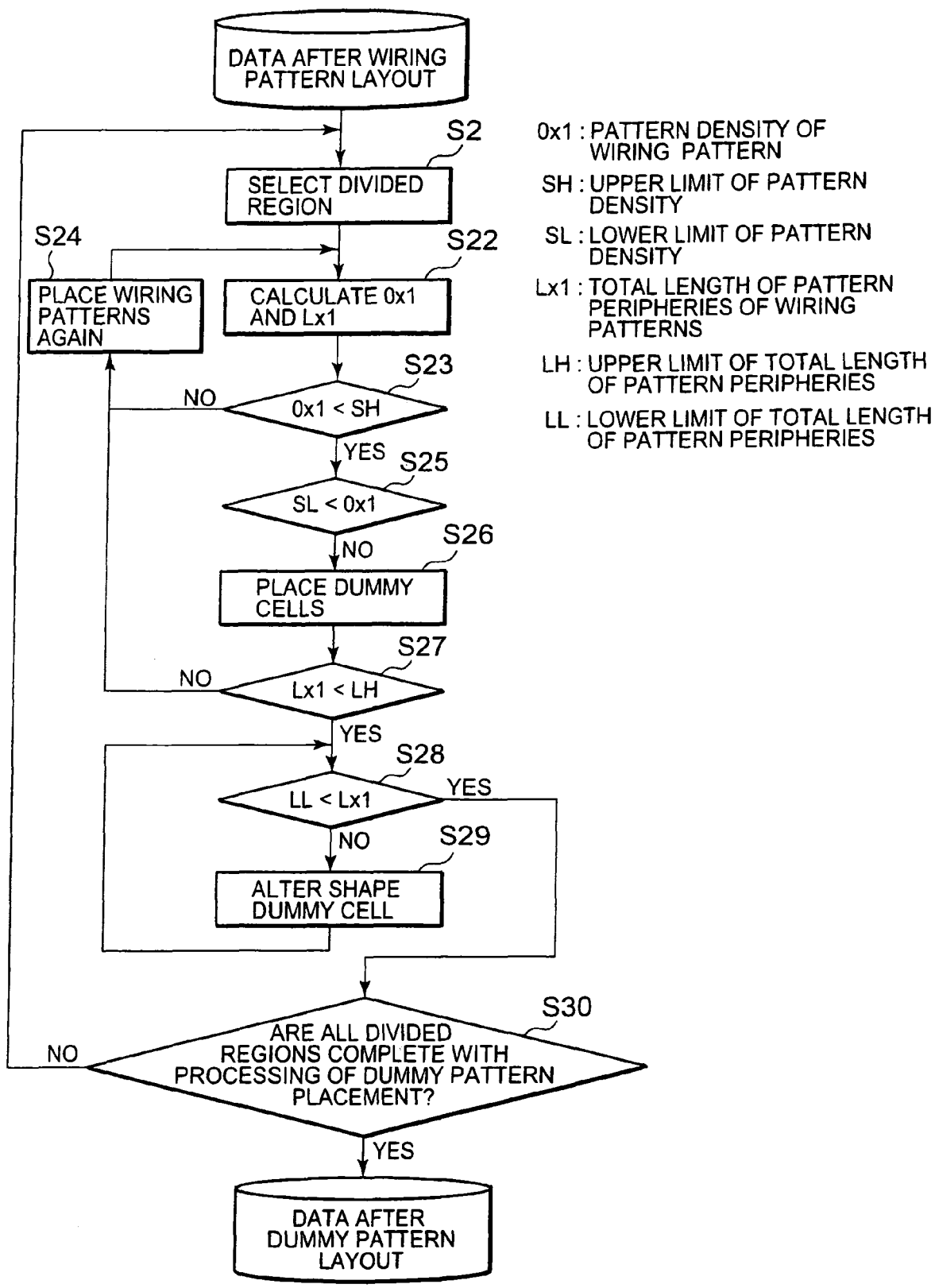
FIG. 13 is a flow chart of a method of placing dummy patterns according to a second embodiment.

FIG. 13 shows a flow chart of the method of placing dummy patterns. Please note that the descriptions will be omitted for a case where the density of the wiring patterns is within the specified range and there is no need to add dummy cells. In the flow of placing dummy patterns according to the second embodiment, data collected after laying wiring patterns out, when the placement of wiring patterns is completed, is firstly read in. Next, divided regions are derived from the read data, and one of the derived divided regions is selected (Step S21). Then, the density Ox1 of the wiring patterns and the total length Lx1 of the pattern peripheries in the selected divided region is calculated (Step S22). Following this, the density Ox1 of the wiring patterns is compared with the preset upper limit value SH of the density (Step S23).

In Step S23, when the density Ox1 of the wiring patterns exceeds the upper limit value SH of the density (a branch of NO), the placement of the wiring patterns is performed again (Step S24). Subsequently, Step S22 is performed again. On the other hand, when the density Ox1 of the wiring patterns falls below the upper limit value SH of the density (a branch of YES), the density Ox1 of the wiring patterns is compared with the preset lower limit value SL of the density (Step S25).

Figure 14:
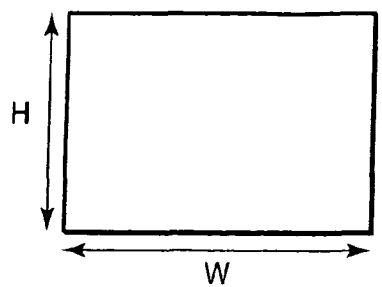
FIG. 14 is a diagrammatic view of dummy patterns to be placed and divided dummy patterns in the flow of placing dummy patterns according to the second embodiment.
Figure 14:
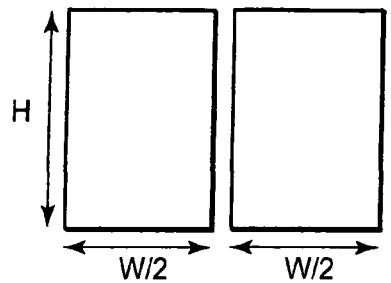
Figure 14:
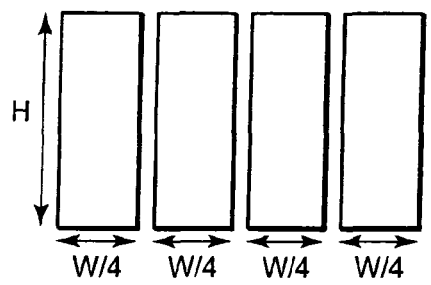
Figure 14:
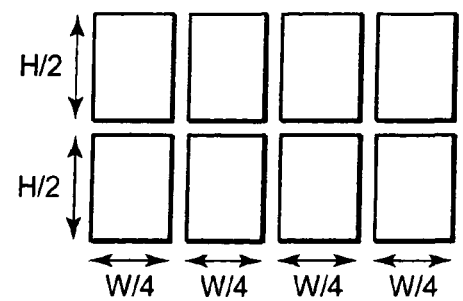
Figure 14:
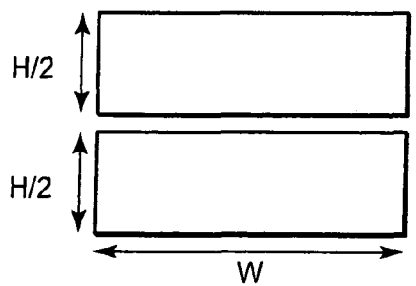
Figure 14:
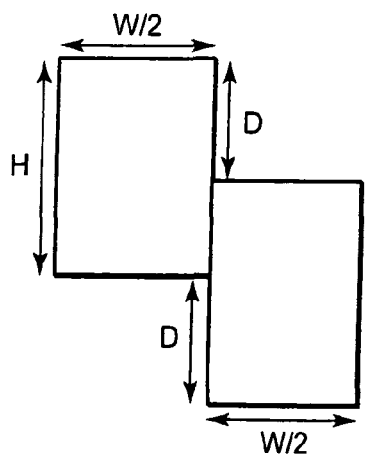
Figure 14:
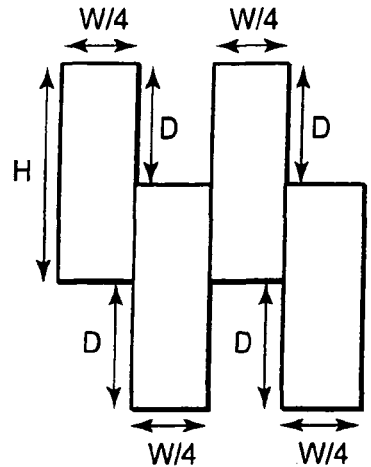

Firstly, descriptions will be given of a case where the density Ox1 of the wiring patterns falls below the lower limit value SL of the density (a branch of NO) in Step S25. In this case, a first placement step where a dummy cell having a specified shape or area is placed is performed (Step S26). In Step S26, the dummy cell to be placed, for example, is a cell in which the area of a pattern formed in the dummy cell is specified. FIG. 14 (a) shows an example of the dummy cell. As shown in FIG. 14 (a), the dummy cell is a dummy pattern having a region of W in width and H in height, for example.

Next, it is judged in Step S27 whether or not the total length Lx1 of the pattern peripheries exceeds the upper limit value LH of the total length of the pattern peripheries. When the total length Lx1 of the pattern peripheries exceeds the upper limit value LH of the total length of the pattern peripheries in Step S27 (a branch of NO), the process goes back to Step S24, and the placement of the wiring patterns is performed again. On the other hand, when the total length Lx1 of the pattern peripheries falls below the upper limit value LH in Step S27, it is judged in Step S28 whether or not the total length Lx1 of the pattern peripheries falls below the lower limit value LL of the total length of the pattern peripheries.

In Step S28, when the total length Lx1 of the pattern peripheries exceeds the lower limit value LL, the wiring patterns in the selected divided region falls within the specified ranges in terms of both of the pattern density and the total length of the pattern peripheries. Hence, it is finished to check the relevant divided region, and the process goes to Step S30. On the other hand, when the total length Lx1 of the pattern peripheries falls below the lower limit value LL in Step S28, a second placement step where the shape of the dummy cell placed in Step S26 is changed is performed (Step S29). The change in the shape of the dummy cell is made by dividing the dummy pattern in the dummy cell, for example. FIGS. 14 (b) to (g) show examples of ways in which the dummy pattern is divided. As an example of the division, the dummy pattern shown in FIG. 14 (a) is firstly divided into two in order to have the shape of the dummy patterns as shown in FIG. 14 (b). Accordingly, the total length of the peripheries of the dummy patterns is 4H+2W in FIG. 14 (b) while that is 2H+2W in FIG. 14 (a). Then, if the total length of the peripheries of the dummy patterns still does not meet the lower limit value LL, the dummy patterns in FIG. 14 (b) are further divided into pieces as shown in FIGS. 14 (c) and (d). Accordingly, the total length of the peripheries of the dummy patterns is 8H+2W in FIG. 14 (c), and is 8H+4W in FIG. 14 (d). If you compare FIG. 14 (a) with FIG. 14 (d), the total v length of the peripheries of the dummy patterns is larger than doubled. Additionally, the dummy patterns in FIG. 14 (d) are simply obtained by dividing the dummy pattern in FIG. 14 (a), so that there is no change in pattern density.

Please note that the process of Step S29 is repeatedly performed until the total length Lx1 of the pattern peripheries exceeds the lower limit value LL in Step S28. Furthermore, in Step S28, a gap between the total length Lx1 of the pattern peripheries and the lower limit value LL may be calculated, and the shape of the dummy patterns after the division may be decided based on the gap.

Figure 15:
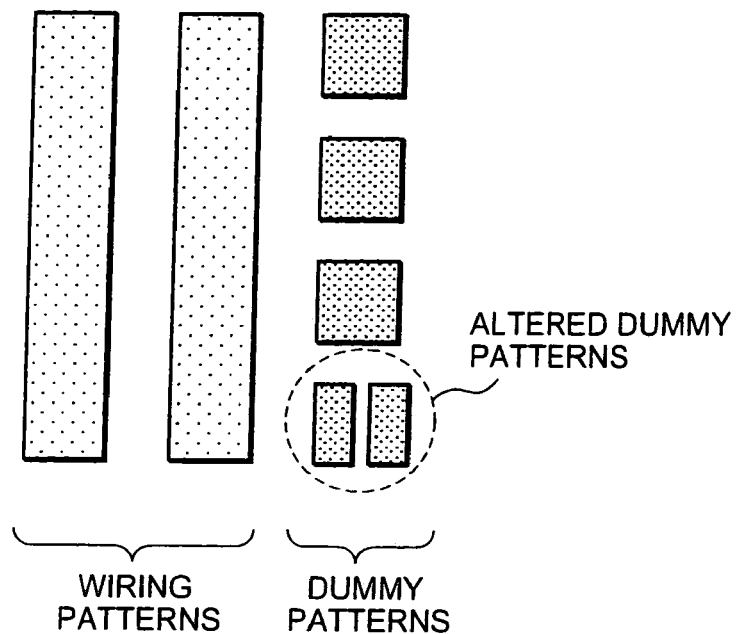
FIG. 15 is a diagrammatic view of layout after completing the flow of placing dummy patterns according to the second embodiment.
Figure 16:
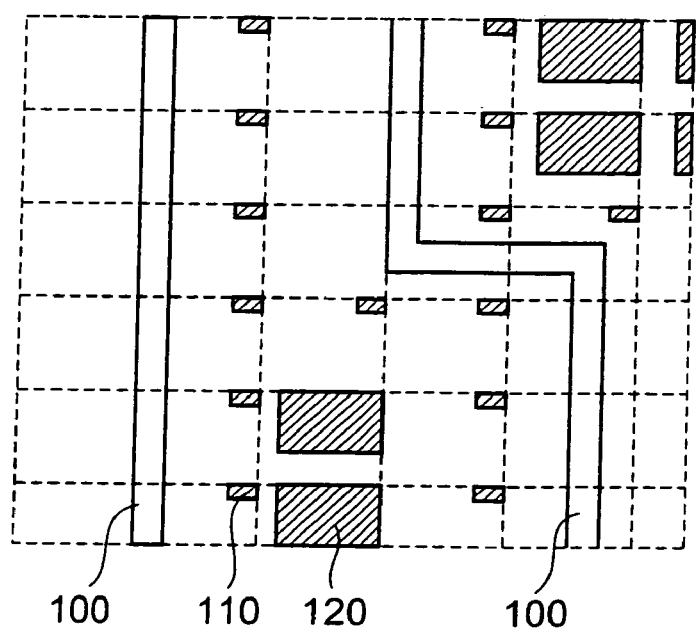
FIG. 16 is a diagrammatic view of the layout of a semiconductor device of a related art.

As other examples of the division, there are FIG. 14 (e), FIGS. 14 (f) and (g) and the like. In terms of dummy patterns in FIGS. 14 (f) and (g), the total length of the pattern peripheries is changed in accordance with displacement amount D of the dummy patterns obtained by dividing the length of the peripheries. It is made possible to make detailed adjustments than those implemented by the division, by adjusting the total length of the pattern peripheries based on the displacement amount D. In other words, as long as the dummy pattern is a polygon, there will be no problem, so that the periphery length is adjusted by dividing the dummy pattern or altering the shape of the dummy pattern. FIG. 15 shows a diagrammatic view of the layout after performing such a process. In an example shown in FIG. 15, among dummy patterns, second dummy patterns placed in the lowermost part of the drawing are obtained by dividing a first dummy pattern placed above the second dummy patterns into two. When the above flow is performed, the area of a first dummy pattern is the same as that of the second dummy patterns.

Subsequently, when there is any unprocessed divided region in Step S30 (a branch of NO), the process goes back to S1 again. When it is judged that all the divided regions are complete with the processing, the flow of placing dummy patterns completes. Please note that the above flow is also achieved by a semiconductor design apparatus and a program for a computer also in the method of placing dummy patterns according to the second embodiment, similarly to the first embodiment. Moreover, in the method of placing dummy patterns according to the second embodiment, a dummy pattern placement unit 34 has a first pattern placement unit which performs the first placement step and a second pattern placement unit which performs the second placement step.

With the method of placing dummy patterns according to the second embodiment, it is possible to firstly set the pattern density alone to be within the range of the condition and afterwards change the total length of the pattern peripheries alone. Consequently, it is possible in the method of placing dummy patterns according to the second embodiment to simplify the processing compared with the method of placing dummy patterns according to the first embodiment.

Please note that the present invention is not limited to the above embodiments, but can be modified in various ways as long as they do not depart from the spirit thereof. For example, the area of a divided region can be set appropriately. Moreover, although the difference values of the parameters are calculated based on the upper and lower limit values of the parameters in the above embodiments, the difference values of the parameters can be ones among the divided regions. Even in this case, it is possible that variations in the pattern density and the total length of the pattern peripheries in the wiring region fall within the specified ranges. Accordingly, it is possible to achieve the same effects as those of the above embodiments.

Further, it is noted that, Applicant's intent is to encompass equivalents of all claim elements, even if amended later during prosecution.

What is claimed is:

1. A semiconductor device, comprising:
a first wiring pattern in a first region;
a second wiring pattern in a second region; and
at least one first dummy pattern formed in the first region and at least one second dummy pattern formed in the second region,
wherein a total area of the at least one first dummy pattern is the same as a total area of the at least one second dummy pattern and a total length of pattern periphery of the at least one second dummy pattern is longer than a total length of pattern periphery of the at least one first dummy pattern.

2. The semiconductor device according to claim 1, wherein a difference between a pattern density of the first wiring pattern in the first region and a pattern density of the second wiring pattern in the second region falls within a first range, and a difference between a total length of pattern periphery of the first wiring pattern in said first region an region a total length of pattern periphery of the second wiring pattern in said second region falls within a second range.

3. The semiconductor device according to claim 1, wherein the at least one second dummy pattern comprises a polygon.

4. A semiconductor device, comprising:
a first wiring pattern in a first region;
a second wiring pattern in a second region; and
a first dummy polygon pattern formed in the first region and a second dummy polygon pattern formed in the second region, wherein an area of the first dummy polygon pattern is the same as an area of the second dummy polygon pattern and a total length of pattern periphery of the second dummy polygon pattern is longer than a total length of pattern periphery of the first dummy polygon pattern.

5. A semiconductor device, comprising:

a first wiring pattern in a first region;

a second wiring pattern in a second region; and a first dummy polygon pattern formed in the first region and a second dummy polygon pattern formed in the second region, wherein an area of the first dummy polygon pattern is the same as an area of the second dummy polygon pattern and a number of sides of the second dummy polygon pattern is larger than a number of sides of the first dummy polygon pattern.

* * * * *